United States Patent [19]
Chu et al.

[11] B 3,996,481
[45] Dec. 7, 1976

[54] FET LOAD GATE COMPENSATOR

[75] Inventors: William M. Chu; James M. Lee, both of Poughkeepsie, N.Y.

[73] Assignee: International Business Machines Corporation, Armonk, N.Y.

[22] Filed: Nov. 19, 1974

[21] Appl. No.: 525,133.

[44] Published under the second Trial Voluntary Protest Program on March 23, 1976 as document No. B 525,133.

[52] U.S. Cl. .............................. 307/262; 307/279; 328/55; 328/155
[51] Int. Cl.² ......................................... H03K 1/12
[58] Field of Search ......... 328/55, 155; 307/221 D, 307/304, 262, 279

[56] References Cited
UNITED STATES PATENTS

| | | | |
|---|---|---|---|
| 2,883,536 | 4/1959 | Salisbury et al. ................. | 328/155 |
| 3,206,686 | 9/1965 | Goor .............................. | 328/55 X |

Primary Examiner—Paul L. Gensler
Attorney, Agent, or Firm—Sughrue, Rothwell, Mion & Zinn

[57] ABSTRACT

An FET load gate compensator employing feedback to control the load gate voltage holds the circuit delay and power dissipation of an integrated circuit nearly constant. The integrated circuit chip is provided with several stages of inverters which act as a delay sensor to simulate the delay of the operational circuit on the chip. The time delay of the delay sensor on the integrated circuit chip is compared with an external clock reference by a delay comparator. The delay comparator generates an output voltage which is used to adjust the load gate voltage until the delay in the delay sensor is equal to the clock reference. Since the same load gate voltage is distributed in the rest of the operational circuits in the integrated circuit chip, the delay times of these circuits will track with that of the delay sensor and thus also tend to be held constant.

12 Claims, 11 Drawing Figures

FET LOAD GATE COMPENSATOR

BACKGROUND OF THE INVENTION

1. Field of the Invention

The present invention generally relates to field effect transistor (FET) circuits having particular application to integrated circuit technology, and more specifically to an FET load gate compensator which will hold the circuit delay and power dissipation of an integrated circuit chip nearly constant.

2. Description of the Prior Art

In integrated circuits employing FETs there are several parameters which, while fixed in a particular integrated circuit chip, may vary from integrated circuit chip to chip due to manufacturing tolerances. These include the transconductance ($\gamma_m$) of the FETs, the threshold voltage ($V_T$) of the FETs, the device width and length of the FETs, and the capacitive leadings of the interconnections. Besides these on-chip parameters, there are external variables such as temperature, and supply voltages, which may vary from application to application or within a specific application of the integrated circuits. The variation in on-chip parameters and the external variables associated with a particular application of the integrated circuit all contribute to variations in circuit delay and power dissipation of the integrated circuit chips. This complicates design requiring delay calculations and race condition considerations. Furthermore, input noise immunity is degraded because of the relationship of circuit delay and power dissipation due to variations in supply voltages. While it is known to provide a source of regulated supply voltage to overcome in part these problems, such regulated voltage supplies are complicated and employ Zener diodes. Such regulated voltage supplies cannot compensate for variations in on-chip parameters.

SUMMARY OF THE INVENTION

It is therefore an object of the present invention to provide a device which will tightly regulate circuit delay and power dissipation of FET integrated circuit chips in spite of a wide range of device parameters and operating conditions.

According to the present invention, the foregoing and other objects are attained by providing a load gate compensator the operation of which is based on the comparison of the circuit delay in the chip with an external time reference and adjusting the load gate voltage ($V_{LG}$) until the two are equal. The time reference is assumed to come from the system clock, which is usually available and usually has a very accurate repetition rate. The circuit delay is measured using a delay circuit sensor in the chip. Preferably, this takes the form of several stages of FET inverters which simulate the average delay of the operational circuit on the chip. The comparison of the delay time of the delay sensor with the clock reference is made with a delay comparator which generates an output voltage to control $V_{LG}$. The range of $V_{LG}$ can be as wide as from 5 to 12 volts, depending on the standard deviation of the device parameters. The $V_{LG}$ of each integrated circuit chip is a function of the device parameters and the operating environment of that chip.

BRIEF DESCRIPTION OF THE DRAWINGS

The specific nature of the invention, as well as other objects, aspects, uses, and advantages thereof will clearly appear from the following description and from the accompanying drawings, in which.

DESCRIPTION OF THE PREFERRED EMBODIMENT

Figure 1:
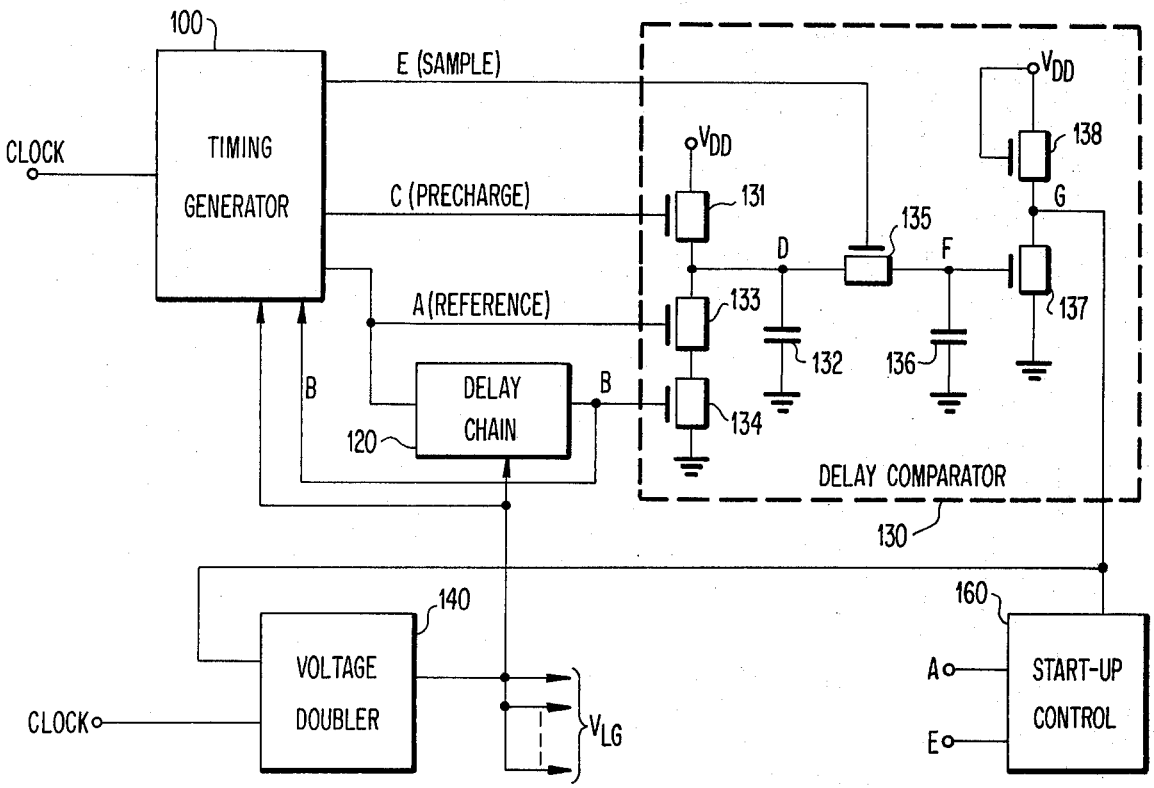
FIG. 1 is a block diagram of the preferred embodiment of the load gate compensator according to the invention.

In the following description of the preferred embodiment, N-channel FET technology is assumed by way of illustration only and not limitation of the invention. Referring now to the drawings wherein like reference numerals designate identical or corresponding parts throughout the several figures, and more particularly, to FIGS. 1 and 2, there is shown a block diagram and a timing diagram, respectively, which illustrate the operation of the load gate compensator according to this invention. The timing generator 100 generates three pulses designated A, C and E that are required by the delay comparator 130. Pulse A whose pulse width is a function of the clock input repetition rate only, provides a time reference $T_{REF}$. An output pulse B is obtained from the delay chain or sensor 120 on the integrated circuit chip. The time delay $T_d$, between pulses A and B is a measure of the circuit delay in the chip. The delay comparator 130 detects whether Td is greater or smaller than $T_{REF}$ by sensing the absence or presence of an overlap between pulses A and B.

Each delay comparison cycle requires four clock cycles to complete the operation. First, node D in the delay comparator 130 is precharged during clock cycle 1. This is accomplished by applying the precharge pulse C to the gate electrode of FET 131. This causes FET 131 to conduct thereby precharging capacitor 132 to a voltage equal to the supply voltage, $V_{DD}$, or the amplitude of pulse C minus the threshold voltage, $V_T$, of the FET 131, whichever is lower. The A pulse comes during clock cycle 2 and is applied to the gate electrode of FET 133. The B pulse is applied to the gate electrode of FET 134 which has its drain connected to the source of FET 133. If the time delay through the delay chain 120 is less than $T_{REF}$, the B pulse will overlap the A pulse as shown in clock cycle 2 in FIG. 2. This causes FETs 133 and 134 to conduct simultaneously resulting in the discharge of node D. The sampling pulse E is applied to the gate electrode of FET 135. During the sampling time, clock cycle 4, FET 135 is turned on, and the charge in capacitors 132 and 136 is redistributed. Since capacitor 132 is much larger than capacitor 136, the voltage across capacitor 136 will be very close to that of the voltage across capacitor 132 before it is sampled. As a result, node F will drop to near ground potential. Node F is connected to the gate electrode of FET 137 having a load FET 138 connected to its drain electrode. When node F drops to near ground potential, node G will rise. The output voltage at node G is supplied to a voltage doubler 140, and the rise in voltage at node G results in a decline in $V_{LG}$ until $T_d > T_{REF}$.

Figure 2:
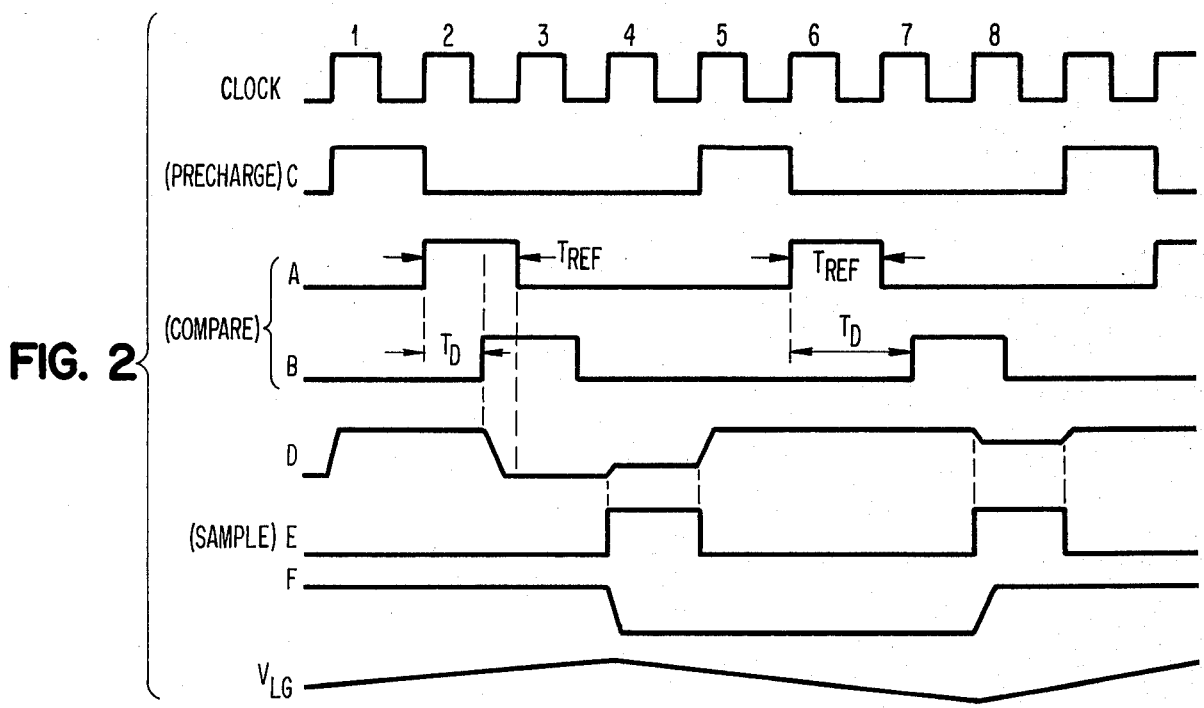
FIG. 2 is a timing diagram illustrating the operation of the load gate compensator shown in FIG. 1.

When $V_{LG}$ falls to a level such that $T_d > T_{REF}$, as illustrated in clock cycles 6 and 7 in the timing diagram of FIG. 2, the precharged node D will remain charged during the sampling time in clock cycle 8. Node F will rise, node G will fall, and $V_{LG}$ will rise until $T_d < T_{REF}$. As a practical matter, it may take many delay comparison cycles to reverse the direction of $V_{LG}$, especially if the time constant of the $V_{LG}$ node is very large. The larger the time constant, the smaller the ripple $V_{LG}$ wil have.

Figure 3:
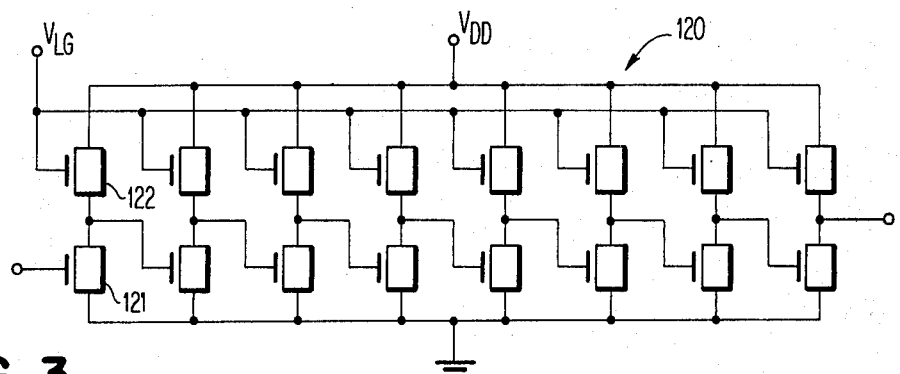
FIG. 3 is a schematic diagram of a typical delay chain or sensor used to simulate the operational circuit delay on an integrated circuit chip.

A typical delay chain 120 is illustrated in FIG. 3. The delay chain has eight stages of inverter in the test chip. Each inverter stage comprises an FET 121 with its associated load FET 122. The supply voltage $V_{DD}$ is connected to the drains of each of the load FETs 122, while $V_{LG}$ is connected to the gate electrodes of each of the load FETs 122. The requirements of the delay chain are that its nominal delay equal $T_{REF}$ and that it contain an even number of stages. For better compensation, the delay chain should contain circuits and loadings that are typical of the operational circuit on the integrated circuit chip. The delay chain may be distributed across the integrated circuit chip so that it will sample the average circuit delay.

Figure 4:
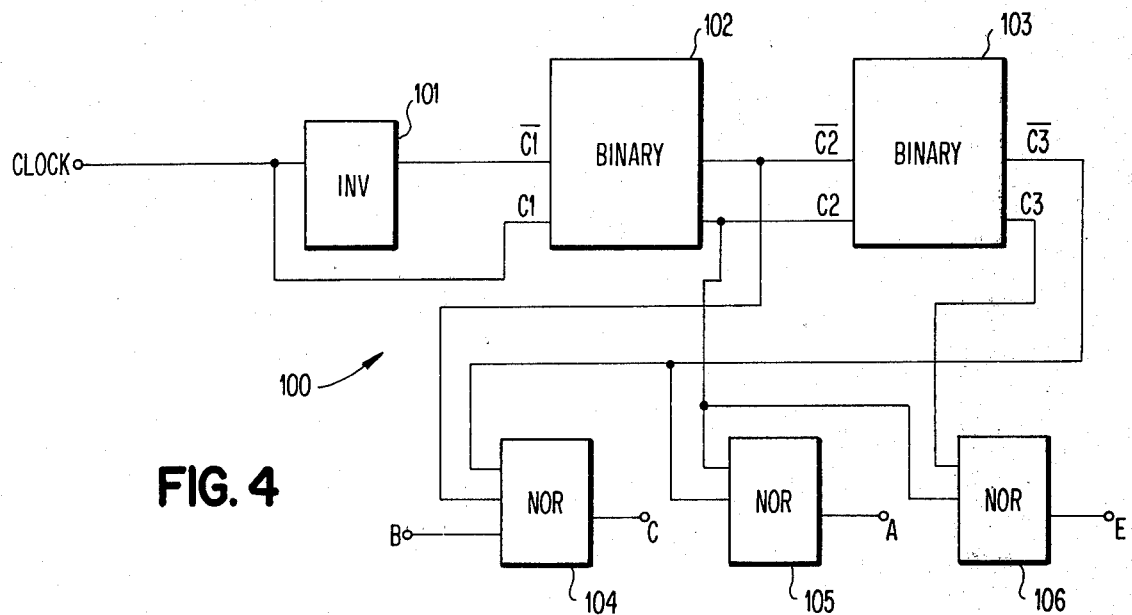
FIG. 4 is a block diagram of a timing generator which may be used in the load gate compensator shown in FIG. 1.
Figure 5:
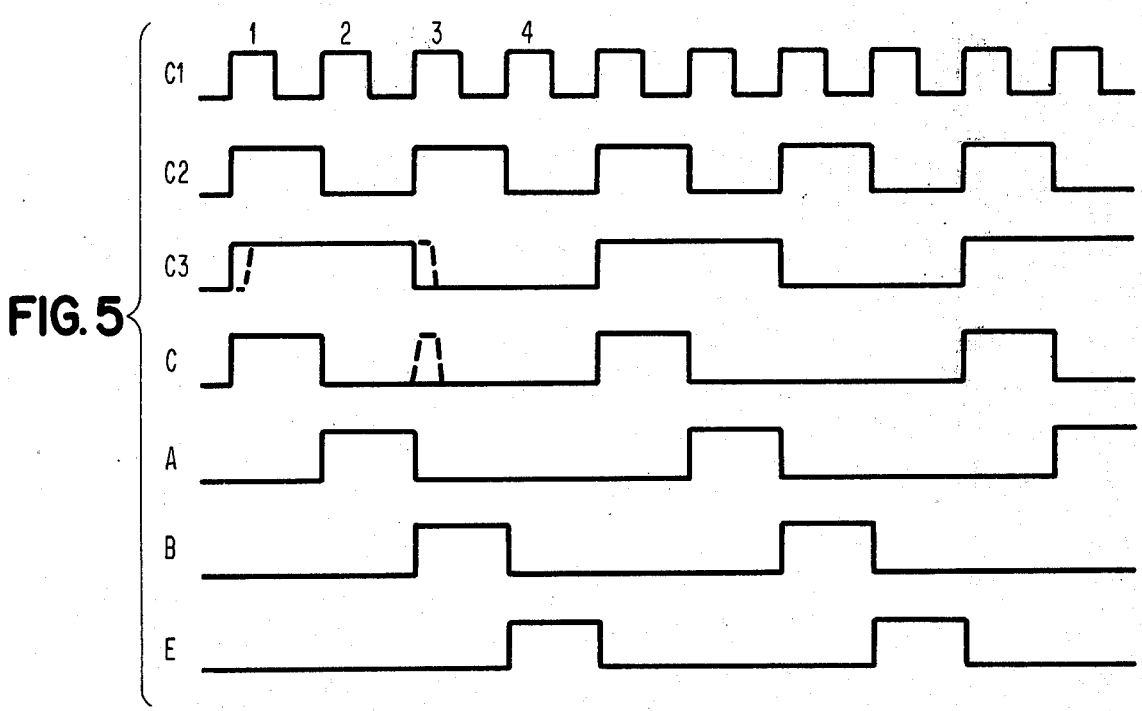
FIG. 5 is a timing diagram illustrating the operation of the timing generator shown in FIG. 4.

A simple implementation of the timing generator 100 is illustrated in FIGS. 4 and 5 of the drawings. The external clock reference is connected to inverter 101 to generate the clock signal $\overline{C1}$. The clock signals C1 and $\overline{C1}$ are connected to the two inputs of a first binary or flip-flop 102. The outputs, C2 and $\overline{C2}$, are connected to the two inputs of binary 103. Binaries 102 and 103 constitute a two-stage binary counter which divides the clock pulse frequency as is shown in the timing diagrams C2 and C3 in FIG. 5. The $\overline{C2}$ output of binary 102 and $\overline{C3}$ output of binary 103 are connected as two inputs of NOR gate 104 to produce the timing generator precharge pulse C. NOR gate 104 additionally receives as an input the output pulse B of delay chain 120. The purpose of connecting the output of delay chain 120 to the third input of NOR 104 is to eliminate the pulse spike that might occur at the output of NOR gate 104 during the beginning of clock cycle 3. In actuality, there is a delay between C3 and C2, as indicated by the dotted line in FIG. 5. As a result, both C2 and C3 are up for a short period of time during the beginning of clock cycle 3. Therefore, $\overline{C2}$ and $\overline{C3}$, the two inputs NOR gate 104, are down during that time, and this would cause a pulse spike to appear at the output of NOR gate 104 if it were not for pulse B holding down the output of the NOR gate. It should be noted that if the B pulse appears later in time, a pulse spike will be present at the output of the NOR gate 104; but this situation occurs only when $T_d > T_{REF}$ and the pulse spike would not alter the operation of the system under that condition. The C2 output of binary 102 and the $\overline{C3}$ output of binary 103 are connected to the two inputs of NOR gate 105 to generate the timing generator reference pulse A. Finally, the C2 output of binary 102 and the C3 output of binary 103 are connected to the two inputs of NOR gate 106 to produce the sample output pulse E of the timing generator.

It is essential to hold the width, the rise time, and the fall time of the timing generator reference pulse A close to a constant under any condition in order to minimize the delay tolerance. Therefore, as shown in FIG. 1 of the drawings, $V_{LG}$ is supplied to the timing generator 100. This, in addition to accomplishing a minimum delay tolerance, will also reduce the power dissipation of the timing generator. $T_{REF}$ is dependent on the period of the external clock pulse only. It is independent of the clock pulse rise time, fall time, and duty cycle; otherwise, additional delay tolerance would be introduced.

Figure 6:
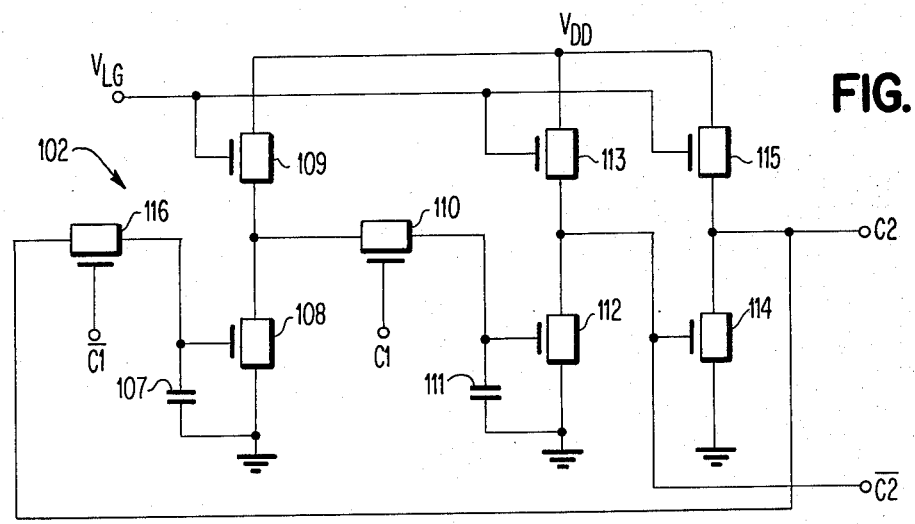
FIG. 6 is a circuit diagram of a binary or flip-flop which may be used in the timing generator shown in FIG. 4.
Figure 7:
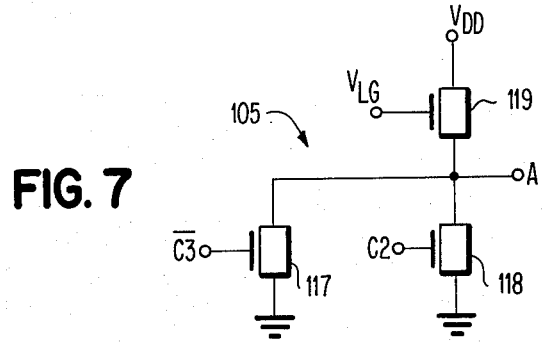
FIG. 7 is a circuit diagram of a typical two-input NOR gate which may be used in the timing generator shown in FIG. 4.

FIGS. 6 and 7 illustrate, respectively, typical circuit diagrams for the binaries and NOR gates shown in block diagram form in FIG. 4. Referring first to FIG. 6 and taking binary 102 as exemplary, a charging capacitor 107 is shown connected across the gate and source electrodes of FET 108. A load FET 109 is connected to the drain electrode of FET 108. The supply voltage $V_{DD}$ is connected to the drain of load FET 109, while $V_{LG}$ is connected to the gate electrode of load FET 109. The C1 input terminal of the binary 102 is connected to the gate electrode of FET 110 which is connected between the drain electrode of FET 108 and capacitor 111. Capacitor 111 is connected across the gate and source electrodes of FET 112. Connected to the drain electrode of FET 112 is a load FET 113 having the same voltage connections as load FET 109. The drain electrode of FET 112 is connected both to the gate electrode of FET 114 and the output terminal $\overline{C2}$ of the binary 102. A third load FET 115 is connected to the drain electrode of FET 114. The drain electrode of FET 114 is connected both to the C2 output terminal of the binary 102 and through FET 116 to the capacitor 107. The second input terminal $\overline{C1}$ is connected to the gate electrode of FET 116.

The operation of binary 102 will be appreciated by reference to the timing diagrams C1 and C2 shown in FIG. 5. It is initially assumed that there is no charge on capacitor 107 so that FET 108 is not conducting. When clock pulse $\overline{C1}$ is up causing FET 110 to conduct, capacitor 111 will be charged through load FET 109. This causes FET 112 to conduct and FET 114 not to conduct. When clock pulse C1 is up, FET 116 conducts charging capacitor 107 through load FET 115. FET 108 is therefore biased into conduction, and when clock pulse C1 is up again capacitor 111 will discharge through FET 108. FET 112 will therefore be off, and FET 114 will be on. Thus, when $\overline{C1}$ is up again, capacitor 107 will be discharged through FET 114 thereby completing the cycle.

The NOR gate 105 is illustrated in FIG. 7 and is exemplary of the NOR gates which may be used in the timing generator 100. It will be understood, of course, that a three input NOR gate such as NOR gate 104 is an obvious extension of the circuit shown in FIG. 7. In FIG. 7, the $\overline{C3}$ output of binary 103 is connected to the gate electrode of FET 117, while the C2 output of binary 102 is connected to the gate electrode of FET 118. FETs 117 and 118 share a common load FET 119. Again, the supply voltage $V^{--}$ is connected to the drain electrode of FET 119, while $V_{LG}$ is connected to the gate electrode of FET 119. The output reference pulse A of the timing generator 100 is taken at the common junction of the drain electrodes of FETs 117 and 118. The output pulse A occurs only when both of the FETs 117 and 118 are not conducting, and this condition is satisfied only when both $\overline{C3}$ and C2 are down.

Figure 8:
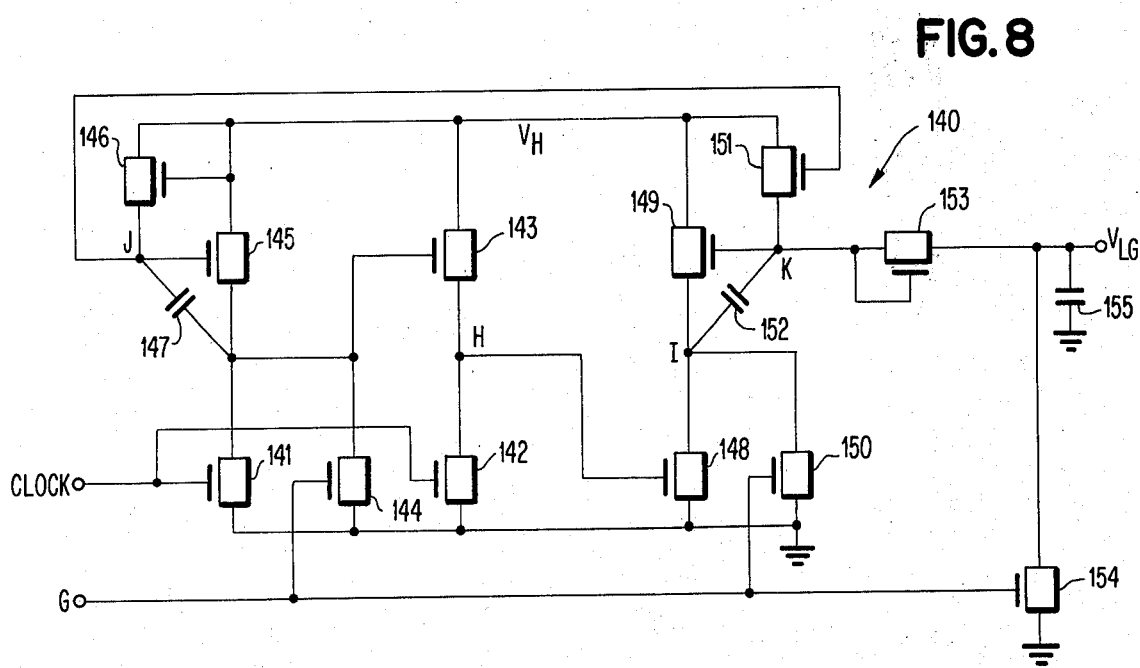
FIG. 8 is a circuit diagram of a voltage doubler circuit which may be used in the load gate compensator shown in FIG. 1.

A circuit which may be used as the voltage doubler 140 is shown in FIG. 8 of the drawings. This voltage doubler circuit needs an A.C. input to generate an output that is higher than the supply voltage. The A.C. input can be derived either from the external clock pulse or from an on-chip ring oscillator. This A.C. input is connected to the gate electrodes of FETs 141 and 142. The drain electrode of FET 142 is connected to the source electrode of FET 143, while the gate electrode of FET 143 is connected to the drain electrodes of FETs 141 and 144. The source electrodes of FETs 141, 142, and 144 are connected in common to ground, and the drain electrode of FET 143 is connected to a source of supply voltage $V_H$. The drain electrodes of FETs 141 and 144 are also connected to the source electrode of FET 145. The drain electrodes of FETs 145 and 146 and the gate electrode of FET 146 are connected in common to the source of supply voltage. A capacitor 147 is connected between the source electrode of FET 145 and the common node J between the gate electrode of FET 145 and the source electrode of FET 146.

The circuit of the voltage doubler thus far described constitutes a push-pull driver stage having outputs at nodes J and H. The output taken at node H at the drain electrode of FET 142 is connected to the gate electrode of FET 148. The drain electrode of FET 148 is connected in common to node I with the source electrode of FET 149 and the drain electrode of FET 150. The source electrodes of FETs 148 and 150 are connected in common to ground. The drain electrodes of FETs 149 and 151 are connected in common to the source of supply $V_H$. A second capacitor 152 is connected between node I and node K at the junction between the source electrodes of FET 151 and the gate electrode of FET 149. The gate electrode of FET 151 is connected to node J. FETs 148, 149, 150 and 151 constitute the output stage of the voltage doubler 140, and the output at node K is coupled through diode connected FET 153 to the $V_{LG}$ terminal. Also connected to the $V_{LG}$ terminal is the drain electrode of a FET 154. The gate electrodes of FETs 144, 150, and 154 are connected in common to the output node G of the delay comparator 130. A capacitor 155 is shown connected in shunt with the $V_{LG}$ terminal and represents the load capacitance but may also include a filter capacitor for the purpose of minimizing ripple on $V_{LG}$.

The push-pull driver stage of the voltage doubler 140 drives the output stage at nodes H and J. When the clock input is down, node H is up and node I is down. Since FET 141 is not conducting, node J rises above the supply voltage $V_H$ because of the feedback capacitor 147. In the case when FET 144 is on, node J will rise to $V_H$ minus $V_T$, where $V_T$ is the threshold voltage of FET 146. The very high gate voltage on FET 151 results in node K being charged to the supply voltage $V_H$. When the clock input rises to the up level, node I will rise to $V_H$ thereby pushing node K to nearly twice $V_H$ through feedback capacitor 152. As a practical matter, however, it takes many cycles before $V_{LG}$ can be charged to $2 V_H - V_T$ through the FET diode 153. Any leakage current at the $V_{LG}$ terminal will, in addition, reduce the maximum level that it can reach. A positive voltage at node G will reduce $V_{LG}$ by discharging the capacitance 155 and by limiting voltage swings at nodes J and K.

There are conditions under which $V_{LG}$ may not be able to build up when power is turned on. The start-up control 160 shown in FIGS. 1 and 9 prevents this from happening. If the clock is not present when power is turned on, node F in the delay comparator 130 will be at a down level because the precharge pulse C and the sample pulse E from the timing generator 100 will not be present to charge node F. Node G will therefore be up, and $V_{LG}$ would be clamped down. If the clock is applied to the input of the timing generator 100 subsequently, no timing pulse will be generated because that circuit requires $V_{LG}$ for its operation. Thus, the system would never start. With the start-up control 160, however, node G is clamped down until $V_{LG}$ rises to an operating level.

Figure 9:
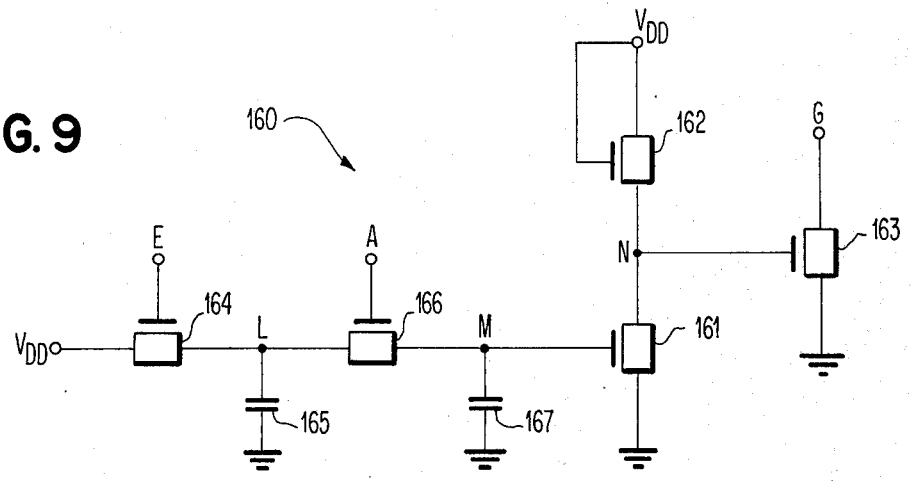
FIG. 9 is a circuit diagram of a start-up control which may be used in the load gate compensator shown in FIG. 1.

The start-up control circuit is shown in FIG. 9 and comprises a FET 161 having its drain electrode connected to a load FET 162. The drain electrode of FET 161 is connected to the gate electrode of FET 163. The drain electrode of FET 163 is connected to node G of the delay comparator 130, while the source electrode of FET 163 is connected to ground. At start-up in the absence of output pulses from the timing generator 100, FET 161 is off and FET 163 is on clamping node G to ground.

A pulse detection circuit comprising FET 164, capacitor 165, FET 166, and capacitor 167 is connected between the source of supply voltage $V_{DD}$ and the gate electrode of FET 161. The gate electrode of FET 164 is connected to receive the sample pulse E from the timing generator 100, and the gate electrode of FET 166 is connected to receive the reference pulse A. Before $V_{LG}$ reaches an operating level, pulses E and A will not be present, and node M will be at a down level. As mentioned, this causes node N to be up, holding node G down and allowing $V_{LG}$ to rise. After $V_{LG}$ reaches an operating level, and if the clock is on, pulses A and E will occur in the sequence shown in FIG. 2. The charge will be transferred from the supply voltage $V_{DD}$ to capacitor 165 and thence to capacitor 167 thereby biasing FET 161 into conduction and pulling N down and isolating the start-up control circuit 160 from node G. Thereafter, the load gate comparator will be operating in its normal manner.

Figure 10:
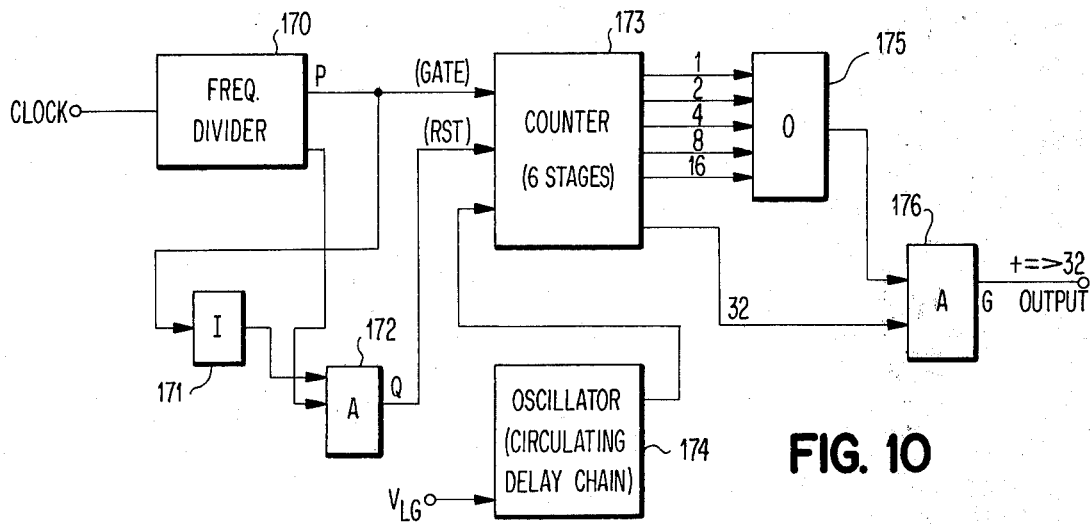
FIG. 10 is a block diagram of an alternative timing generator and delay comparator.
Figure 11:
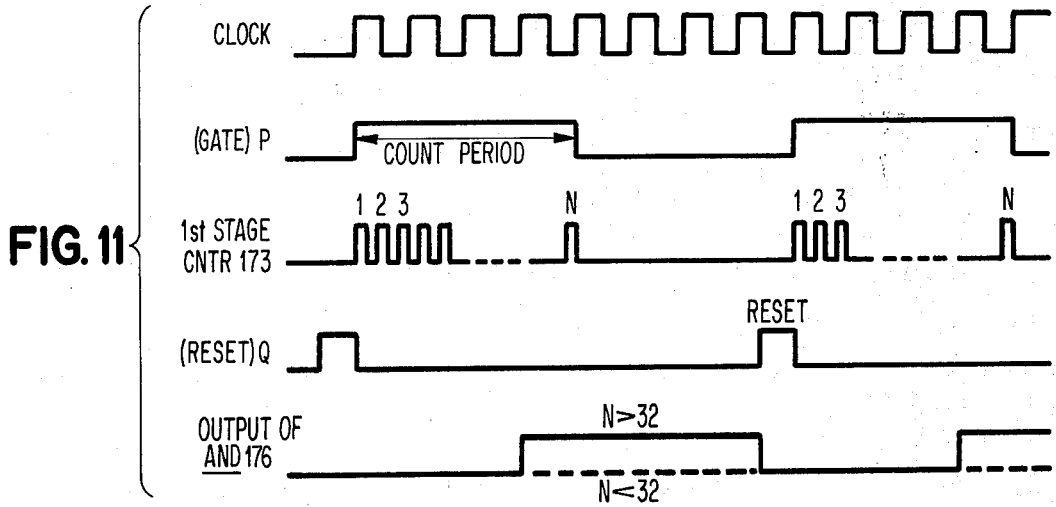
FIG. 11 is a timing diagram illustrating the operation of the alternative timing generator and delay comparator shown in FIG. 10.

Those skilled in the art will recognize that there are other and alternative ways of implementing the load gate compensator according to the teachings of the invention. One such alternative is illustrated in FIGS. 10 and 11 of the drawings. More specifically, FIG. 10 illustrates in block diagram form an alternative to the timing generator 100, delay chain 120, and delay comparator 130 shown in FIG. 1 of the drawings. It will be understood that the output of the delay comparator would be used to control $V_{LG}$ as before.

In the alternative embodiment shown in FIG. 10, the timing generator comprises a frequency divider 170, such as a counter, and inverter 171, and an AND gate 172. The generator produces a gate pulse P and a reset pulse Q as illustrated in FIG. 11 of the drawings. The chain of the delay sensor is looped back to form an oscillator 174, and the frequency of the oscillation of oscillator 174 is a function of the circuit delay. A six-stage counter 173 is gated on by the gate pulse P to count the output of oscillator 174 and is reset by the reset pulse Q. The clock and the frequency divider 170 determine the time period which the counter 173 will count. The output of the first five stages of counter 173 are connected through OR gate 175 to one input of AND gate 176. The other input of AND gate 176 is connected to the inverted output of the last or sixth stage of counter 173. Counter 173, OR gate 175 and AND gate 176 constitute the delay comparator which will generate a chain of positive pulses if during each period the count is greater than a predetermined value, which in the specific example illustrated is 32. The count of 32 is chosen because it gives reasonable precision of control; a onecount error means approximately 3% error in delay. Obviously, other combinations of clock frequency, oscillator frequency and stages of counter will also work. The number of lines from the frequency divider 170 to the AND gate 172, which generate the reset pulse Q for the counter 173 depends on how many stages are in the frequency divider and how narrow the reset pulse one wishes to have. The output G of the delay comparator taken from the output of AND gate 176 is used exactly in the same way as in the load gate compensator illustrated in FIG. 1 of the drawings.

It is further noted that although the illustrated embodiments utilize N-channel technology, those skilled in the art could easily transform and utilize the concepts of the present invention in P-channel technology. It will therefore be apparent that the embodiments shown are only exemplary and that various modifications can be made in construction and arrangement within the scope of the invention as defined in the appended claims.

We claim:

1. An FET load gate compensator for regulating circuit delay and power dissipation of FET integrated circuits, comprising:
    timing generator means adapted to receive an external clock for generating a time reference signal,
    delay sensor means in an FET integrated circuit chip for simulating the circuit delay of an operational circuit in the FET integrated circuit chip, said delay sensor means producing a signal representing said circuit delay,
    delay comparator means connected to receive said time reference signal and said circuit delay signal for producing a control output signal which varies according to the equality or inequality of the time reference signal and the circuit delay signal, and
    load gate voltage generating means connected to supply a load gate voltage to the FET integrated circuit chip and responsive to said control output signal to vary said load gate voltage to cause said circuit delay signal to be equal to said time reference signal.

2. An FET load gate compensator as recited in claim 1 wherein said delay comparator means comprises:
    precharging means connected to a first node for precharging said first node to a predetermined voltage,
    comparing means connected to receive said time reference signal and said circuit delay signal for discharging said first node when said time reference and said circuit delay signals overlap in time, and
    sampling means connected between said first node and a second node for redistributing the charge between said first and second nodes.

3. An FET load gate compensator as recited in claim 2 wherein said timing generator means additionally generates a precharging signal immediately preceding said time reference signal and said precharging means comprises:
    a first FET having first and second gated electrodes and a gate electrode, said gate electrode being connected to receive said precharge signal from said timing generator means, said first gated electrode being connected to a source of supply voltage and said second gated electrode being connected to said first node, and
    a capacitor connected between said first node and a voltage reference, said capacitor being charged by said supply voltage through said first FET when said precharge signal is generated by said timing generator means.

4. An FET load gate comparator as recited in claim 3 wherein said comparing means comprises a second and third FETs each having first and second gated electrodes and a gate electrode, the gate electrode of said second FET being connected to said timing generator means to receive said time reference signal, the gate electrode of said third FET being connected to said delay sensor means to receive said circuit delay signal, the first gated electrode of said second FET being connected to said first node, the second gated electrode of said second FET being connected to said first gated electrode of said third FET, and the second gated electrode of said third FET being connected to a voltage reference.

5. An FET load gate compensator as recited in claim 4 wherein said timing generator means additionally generates a sampling signal a predetermined time after the expected duration of said circuit delay signal and said sampling means comprises:
    a fourth FET having first and second gated electrodes and a gate electrode, the gate electrode of said fourth FET being connected to said timing generator means to receive said sampling signal, the first gated electrode of said fourth FET being connected to said first node and the second gated electrode of said fourth FET being connected to said second node, and
    a second capacitor connected between said second node and a voltage reference, said second capacitor being substantially smaller than said first capacitor so that when said sampling signal occurs the voltage at said second node assumes a value almost equal to the value of the voltage at said first node prior to the occurrence of said sampling signal.

6. An FET load gate compensator as recited in claim 5 wherein said delay comparator means further comprises a fifth FET having first and second gated electrodes and a gate electrode, the gate electrode of said fifth FET being connected to said second node and said control output signal being taken from the first gated electrode of said fifth FET.

7. An FET load gate compensator as recited in claim 1 wherein said delay sensor means comprises a chain of FET inverter stages, each stage including a FET inverter having first and second gated electrodes and a gate electrode, said FET inverter receiving an input at its gate electrode and providing an output at its first gated electrode, and a load FET having first and second gated electrodes and a gate electrode, the second gated electrode of said load FET being connected to the first gated electrode of said inverter FET, the first gated electrode of said load FET being connected to a source of supply voltage, and the gate electrode of said load FET being connected to said load gate voltage generating means.

8. An FET load gate compensator as recited in claim 1 wherein said delay sensor means comprises an oscillator including a chain of FET circuits connected as a circulating delay chain, the frequency of the oscillation being a function of the circuit delay.

9. An FET load gate compensator as recited in claim 8 wherein said delay comparator means comprises:
 a counter connected to said oscillator for counting the output thereof for a predetermined time determined by said time reference signal, said counter having n outputs,
 an OR gate connected to receive the first n-1 outputs of said counter, and
 an AND gate connected to receive as one input the output of said OR gate and as the other input the inverted nth output of said counter, the output of said AND gate being said control output signal.

10. An FET load gate compensator as recited in claim 1 wherein said load gate voltage generating means comprises a voltage doubler.

11. An FET load gate compensator as recited in claim 10 further comprising start-up control means connected to the output of said delay comparator means for inhibiting said control output signal until said load gate voltage reaches an operating level.

12. An FET load gate compensator as recited in claim 10 wherein said load gate voltage is further supplied to said timing generator means.

* * * * *